(12) United States Patent
Maenishi et al.

(10) Patent No.: US 6,289,582 B1
(45) Date of Patent: Sep. 18, 2001

(54) COMPONENT MOUNTING METHOD AND COMPONENT MOUNTING APPARATUS

(75) Inventors: Yasuhiro Maenishi, Kofu; Takeshi Kuribayashi, Nakakoma-gun, both of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/202,180

(22) PCT Filed: Jun. 11, 1997

(86) PCT No.: PCT/JP97/02007

§ 371 Date: Dec. 10, 1998

§ 102(e) Date: Dec. 10, 1998

(87) PCT Pub. No.: WO97/48263

PCT Pub. Date: Dec. 18, 1997

(30) Foreign Application Priority Data

Jun. 11, 1996 (JP) .................................................. 8-149062

(51) Int. Cl.[7] .................................................. H05K 3/30
(52) U.S. Cl. .................................. 29/832; 29/740; 29/833; 29/564.1
(58) Field of Search .......................... 29/825, 832, 740, 29/564.1, 833

(56) References Cited

U.S. PATENT DOCUMENTS

| | | |
|---|---|---|
| 5,224,325 | 7/1993 | Takahashi et al. . |
| 5,402,564 | 4/1995 | Tsukasaki et al. . |
| 5,862,586 * | 1/1999 | Kimura .................................. 29/740 |
| 5,894,657 * | 4/1999 | Kanayama et al. .................... 29/740 |

FOREIGN PATENT DOCUMENTS

| | | |
|---|---|---|
| 0 312 116 | 4/1989 | (EP) . |
| 60-206098 | 10/1985 | (JP) . |
| 62-21300 | 1/1987 | (JP) . |
| 5-104364 | 4/1993 | (JP) . |
| 7-83198 | 9/1995 | (JP) . |

* cited by examiner

Primary Examiner—Carl J. Arbes
(74) Attorney, Agent, or Firm—Wenderoth, Lind & Ponack, L.L.P.

(57) ABSTRACT

Components are arrayed on a component feeder (4) along a direction in which the component feeder moves, in correspondence to respective mounting sequences of the components to be mounted on their respective component mounting positions in a printed board (1). The components arrayed in the array order are successively moved along the mounting sequence by successively moving the component feeder in the feeder moving direction. Thus, the components are mounted to the printed board successively by the component holder.

24 Claims, 6 Drawing Sheets

Fig.4
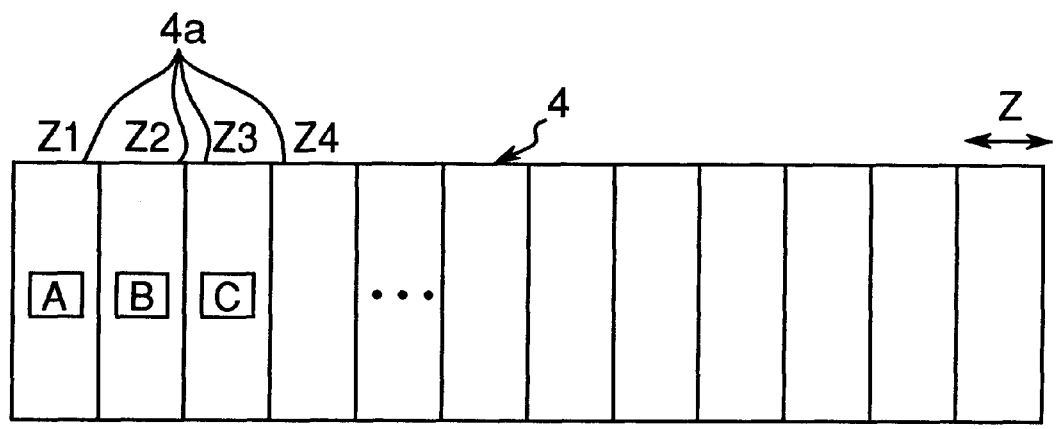
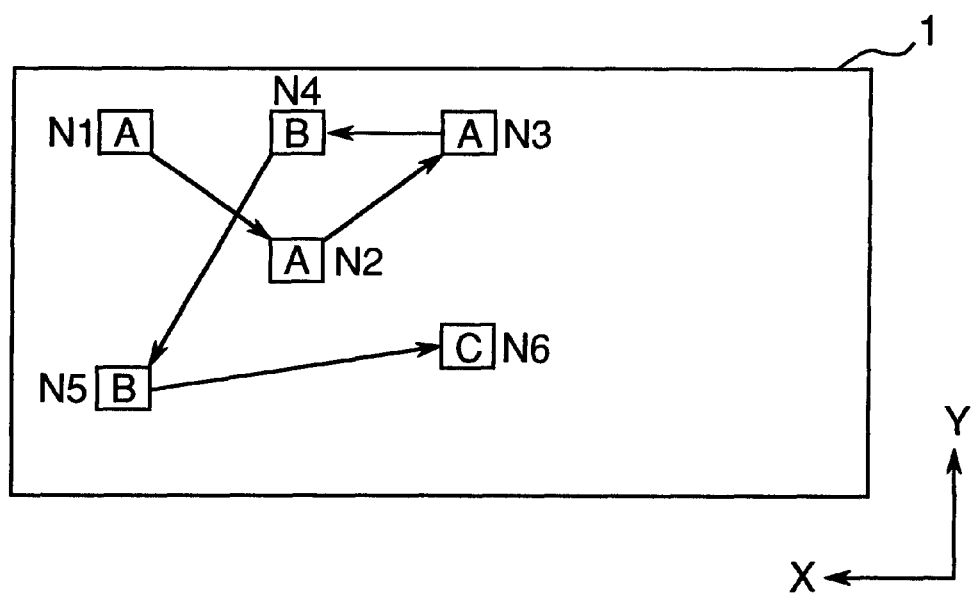

COMPONENT MOUNTING METHOD AND COMPONENT MOUNTING APPARATUS

TECHNICAL FIELD

The present invention relates to a component mounting method and a component mounting apparatus for stably feeding a plurality of types of electronic components to be mounted onto circuit boards and for performing the mounting of a plurality of types of electronic components onto one circuit board in the shortest time.

BACKGROUND ART

A conventional component mounting apparatus and a conventional component mounting method using the component mounting apparatus are described.

As shown in FIG. 3B, a component mounting apparatus 30 generally comprises: a rotating table 7; an X-Y table 3; a component feeder 4; a component feed section 5 to which the component feeder 4 is removably equipped; a rotating-table driver 8 for driving the rotating table 7; a table driver 9 for driving the X-Y table 3; a component-feeding-section driver 10 for driving the component feed section 4; and a component-mounting controller 20 for performing operational control of drivers 8, 9, 10.

The rotating table 7, of which a table body 7a will not move, has suction nozzles 2 which move on a move path along the periphery of the table body 7a and which serve for mounting electronic components 11 onto a printed board 1. The suction nozzles 2 are moved by the rotating-table driver 8 between a component holding position which is one place on the move path and at which the holding of an electronic component 11 is performed, and a hold releasing position which is another place on the move path and at which the holding of the component is released. Moreover, the suction nozzles 2 will move up and down to suck up and mount electronic components. The X-Y table 3, which is located below the rotating table 7, has the printed board 1 placed thereon. Then, for the mounting of an electronic component 11 (which has been transferred to the hold releasing position by a suction nozzle 2) on to the printed board 1 at a component mounting position, the X-Y table 3 moves the printed board 1 so that the component mounting position and the hold releasing position coincide with each other. It is noted that the X-Y table 3 is moved by the table driver 9 in X and Y directions as shown in the figure. The component feeder 4 has a plurality of component accommodating units 4a for accommodating therein a plurality of types of electronic components 11, respectively. The accommodating units 4a are arrayed along the component feed section 5 in a Z direction, as shown in the figure, corresponding to the direction in which the component feeder 4 is moved. The component feeder 4 of such arrangement is moved in the Z direction by the driver 10 so that the electronic component 11 to be mounted is positioned at the component holding position. It is noted that the X, Y and Z directions are within the same plane and that the X and Z directions are parallel to each other.

In the component mounting apparatus 30 as described above, the electronic component 11 is taken out from the component feed unit 4a at the component holding position by the suction nozzle 2, and during the transfer to the hold releasing position, the posture of the electronic component 11 is detected by a recognizer 6. Then, based on the detection result, the electronic component 11 during transfer is corrected in position, and transferred to the hold releasing position. Meanwhile, the X-Y table 3 moves in the X, Y directions so that the component mounting position on the printed board 1 at which the electronic component 11 is to be mounted becomes coincident with the hold releasing position. Accordingly, at the hold releasing position, the suction nozzle 2 mounts the electronic component 11 at the component mounting position on the printed board 1. Further, the printed board 1 is also positionally corrected, as required, by detecting a mark provided on the printed board 1 with the recognizer 6.

Indeed, occurrence of errors in such a component mounting apparatus 30 have been on the decrease with the technical progress of the mounting equipment. However, for the exhaustion of electronic components to be mounted or the occurrence of errors, it has been the case that the operator takes measures of electronic component replenishment or error cancellation upon each occurrence of an error, or of feeding components by the component feeding method as disclosed in Japanese Patent Laid-Open Publication No. 60-206098 or No. 62-21300, by which the production of circuit boards is continued.

Next, the arraying of the electronic components 11 onto the component feeder 4 as well as the decision of a mounting sequence according to the prior art are described with reference to FIGS. 4 and 5. For example, as shown in FIG. 4, assume that 3 pieces of electronic components A, 2 pieces of electronic components B and 1 piece of electronic components C are to be mounted onto the printed board 1. In such a case, according to a flow chart as shown in FIG. 5, first at Step (represented by "S" in the figure) 1, electronic components are classified into groups according to mounting cycle time, which is the time necessary from when one electronic component is taken out from the component feeder 4 until it is mounted onto the printed board 1. Thus, the electronic components are classified into groups having the same mounting cycle time, respectively, and then the groups, are put into an ascending order of the mounting cycle times. In this example, the electronic components A and B have a mounting cycle time of 0.1 second, and the electronic components C have a mounting cycle time of 0.2 second, so that the resulting order of array is A→B→C.

Subsequently at Step 2, based on the processing of Step 1, it is decided which electronic components are placed at the individual component accommodating units 4a located at Z1, Z2, . . . in the component feeder 4. In this example, the electronic components A are placed at Z1, the electronic components B are placed at Z2 and the electronic components C are placed at Z3.

Subsequently at Step 3, an optimization of the mounting sequence is executed based on the processing of Step 2, by which the mounting sequence is decided. In this example, the mounting operation is carried out in a sequence as indicated by arrows within the printed board 1 as shown in FIG. 4. That is, the electronic components A are mounted in an order of a component mounting position N1 to a component mounting position N2 to a component mounting position N3, respectively. Then electronic components B are mounted in an order of a component mounting position N4 to a component mounting position N5, respectively. Finally, an electronic component C is mounted to a component mounting position N6.

The placement of electronic components onto the component feeder 4 as well as the mounting sequence of the electronic components according to the prior art have been determined by such method and procedure as described above. In the above example, the electronic components A set in the Z1 component accommodating unit include 3 pieces, the electronic components B set in the Z2 component accommodating unit include 2 pieces and the electronic component C set in the Z3 component accommodating unit includes 1 piece.

In addition, the operations of Steps 1 to 3 are carried out by the component-mounting controller 20 executing arithmetic operations with the feed of information as to the types of electronic components to be mounted. In other words, controller 20 uses information on the electronic components A, B, C as well as information on the quantities of the individual types of electronic components to be mounted in this example. Information as to the mounting cycle time may be previously stored in the component-mounting controller 20 for each type of electronic component, or otherwise the information may be fed from time to time as required.

However, with the conventional method as described above, the number of electronic components to be mounted on the printed board 1 differs from type to type of electronic components. In other words, the number of electronic components A is 3, the number of electronic components B is 2 and the number of electronic components C is 1. As the three types of electronic components A, B, C are involved in the above example, the electronic components to be mounted on the printed board 1 are arrayed in the component feeder 4 according to the types of electronic components. Therefore, the rate of consumption of electronic components that have been arranged in the component feeder 4 varies depending on the type of electronic components mounted on the printed board 1. Therefore, component exhaustion in the component feed section 5 will randomly occur during the production of the printed board 1. In the above example, 3 pieces of electronic components A are consumed for one printed board 1. If such production of printed boards 1 is continued, an exhaustion of electronic components A will occur first among the electronic components A to C fed to the component feeder 4, and an exhaustion of electronic components B will occur after a while, and an exhaustion of electronic components C will occur after another while.

Such rates of component exhaustion would cause the printed board 1 not to be completed, so that the whole component mounting apparatus would result in a halt each time a component exhaustion has occurred. This would cause an increase in the apparatus halt time involved in the component replacement work. In order to overcome such circumstances, there has been a disadvantage that the operator must monitor the equipment at all times during the operation of the component mounting apparatus.

DISCLOSURE OF INVENTION

An object of the present invention is therefore to provide a high-productivity component mounting method and apparatus which improves the operation rate of the component mounting apparatus. The method also increases unattended operating time that requires no monitoring of the operator, or in other words, continuous operating time.

In accomplishing the object, according to a first aspect of the present invention, there is provided a component mounting method for successively taking out components from a component feeder (which is movable in a component feeder moving direction) by a component holder which holds a component at a component holding position. The component is moved to a hold releasing position and it is released. The taken-out component is mounted at a component mounting position on a printed board held on a movable X-Y table.

The component mounting method comprises arraying the components in the component feeder along the feeder moving direction in accordance with a mounting sequence of the components onto the printed board. The components, which have been arrayed, are successively moved by successively moving the component feeder in one direction which is the feeder moving direction, by moving the component mount position to the hold releasing position by moving the table, and by holding the component from the component feeder by the component holder, and by successively mounting the held component onto the printed board.

According to a second aspect of the present invention, there is provided a component mounting method according to the first aspect, wherein the mounting sequence of the components is such a mounting sequence that an amount of move of the table is minimized in the mounting of components onto the printed board.

According to a third aspect of the present invention, there is provided a component mounting method according to the first or second aspect, wherein a first component to a nth (where n is an integer of 2 or more) component in the components are arrayed in order in the component feeder along the feeder moving direction, and the printed board is placed at an initial mounting position by the table for a start of the mounting. The mounting sequence of the components in this third aspect is such a mounting sequence that a last component mounting position at which a component has just been mounted and a succeeding component mounting position at which a component is next mounted are of the closest distance, throughout a course from the first component mounting position, which is the closest position to the hold releasing position, to the nth component mounting position in the printed board.

According to a fourth aspect of the present invention, there is provided a component mounting method according to the third aspect, wherein the mounting sequence is one in which the last component mounting position at which a component has just been mounted and the succeeding component mounting position at which a component is next mounted are of the closest distance. The table can be movable in an X direction parallel to the feeder moving direction and in a Y direction perpendicular to the X direction within the same plane as the X direction. When the table is movable in this manner, the mounting is carried on along one direction of the X direction and the Y direction. When the mounting to one component mounting position array out of a plurality of component mounting position arrays parallel to the one direction in the printed board is completed, the table is moved in the other direction thereof to a component mounting position array adjacent to the one component mounting position array. Thus, the mounting is performed successively, starting with the first component mounting position.

According to a fifth aspect of the present invention, there is provided a component mounting method according to the first aspect, wherein the components are arrayed to the component feeder. The components to be mounted are classified into a plurality of groups according to mounting cycle time, so that each group of components has the same mounting cycle time. This is done by using a plurality of mounting cycle times corresponding to the components. The components for each of the classified groups are arrayed so that the components are arranged in an ascending order of the mounting cycle times, from the shortest to slowest groups of components. For the components belonging to the same group, the respective components are arrayed in the component feeder in accordance with such a mounting sequence that a table's moving amount is minimized in the mounting of the components onto the printed board.

According to a sixth aspect of the present invention, there is provided a component mounting method according to any one of the first to fifth aspects. This method further comprises: gathering and arraying the same type of components in the component feeder out of the components to be mounted to the printed board, irrespectively of the mounting sequence. The components to be mounted are placed at the component holding position by moving the component feeder according to the mounting sequence. The components are successively mounted onto the printed board by the component holder.

According to a seventh aspect of the present invention, there is provided a component mounting method according to any one of the first to sixth aspects, wherein the component feeder has respective component accommodating units. These units accommodate the respective components to be placed in accordance with the mounting sequence along the feeder moving direction, and the same number of components are accommodated in the respective component accommodating units.

According to an eighth aspect of the present invention, there is provided a component mounting apparatus for successively taking out components from a component feeder which is movable in a component feeder moving direction. The components are taken out by a component holder which holds a component in the components at a component holding position, moves to a hold releasing position, and releases the component from the holding. The component mounting apparatus also mounts the taken-out component at a component mounting position in a printed board held on a movable X-Y table.

The component mounting apparatus comprises a component mounting controller for controlling operation of: arraying the components in the component feeder along the feeder moving direction in accordance with a mounting sequence of the components onto the printed board; and successively moving the components, which have been arrayed. The components are successively moved by successively moving the component feeder in one direction which is the feeder moving direction, moving the component mounting position to the hold releasing position by moving the table, and holding the component from the component feeder by the component holder, and successively mounting the held component onto the printed board.

According to a ninth aspect of the present invention, there is provided a component mounting apparatus comprising a component holder, a component feeder, a table, and a component-mounting controller. The component holder has a component holding portion for holding a component to be mounted to a printed board and releasing the held component from the holding. The component holder moves between a component holding position where the component is held and a hold releasing position where t held component is released from the holding.

The component feeder houses the components to be mounted onto the printed board so that they are arrayed along a direction of move of the feeder. The component feeder moves in the feeder moving direction to enable the component holding portion to hold the component, and positions the component to be mounted at the component holding position.

The table has the printed board placed thereon, and moves the component mounting position to the hold releasing position in order to mount the component at the component mounting position in the printed board. The component-mounting controller controls operation of the table so that the table's moving amount is minimized during the mounting of components onto the printed board. The controller also controls the mounting sequence.

According to a tenth aspect, of the present invention, there is provided a component mounting apparatus according to the ninth aspect, wherein the mounting sequence is controlled by the component-mounting controller. In this case, a first component to a nth (where n is an integer of 2 or more) component are arrayed in the component feeder in order along the feeder moving direction. The printed board is placed at a mounting initial position by the table for a start of the mounting, and the table is moveable in an X direction parallel to the feeder moving direction and in a Y direction perpendicular to the X direction within the same plane as the X direction. At this time, the mounting is carried on along one direction of the X direction and the Y direction. When the mounting to one component mounting position array out of a plurality of component mounting position arrays parallel to the one direction in the printed board is completed, the table is moved in the other direction thereof to a component mounting position array adjacent to the one component mounting position array. The mounting is performed successively from the first component mounting position, which is the closest to the hold releasing position, to the nth component mounting position in the printed board.

According to an eleventh aspect of the present invention, there is provided a component mounting apparatus according to the ninth aspect, wherein the components are arrayed onto the component feeder. The components are arrayed by classifying the components to be mounted into a plurality of groups according to mounting cycle time, so that each group of components has the same mounting cycle time. This classifying is done by using a plurality of mounting cycle times corresponding to the components. The components for each of the classified groups are arrayed so that the components are arranged in an ascending order of the mounting cycle times, from the shortest to slowest groups of components. For components belonging to the same group, the respective components are arrayed in the component feeder such that the table's moving amount is minimized during the mounting of the components onto the printed board.

According to a twelfth aspect of the present invention, there is provided a component mounting apparatus according to any one of the ninth to eleventh aspects, wherein in the component feeder, the same type of components are gathered and arrayed, irrespective of the mounting sequence. The components to be mounted are placed at the component holding position by moving the component feeder according to the mounting sequence, and the components are mounted onto the printed board successively by the component holder.

According to a thirteenth aspect of the present is provided a component mounting apparatus according to any one of the ninth to twelfth aspects, wherein the component feeder has respective component accommodating units for accommodation the respective components to be placed in accordance with the mounting sequence along the feeder moving direction, where the same number of components are accommodated in the respective component accommodating units.

BRIEF DESCRIPTION OF DRAWINGS

These and other aspects and features of the present invention will become clear from the following description taken in conjunction with the preferred embodiments thereof with reference to the accompanying drawings, in which:

FIG. 4 is a view showing the order in which electronic components are arrayed onto the component feeder included in the component mounting apparatus that implements the prior-art component mounting method, and also showing the sequence of mounting onto the printed board and the types of electronic components to be mounted.

BEST MODE FOR CARRYING OUT THE INVENTION

Figure 1:
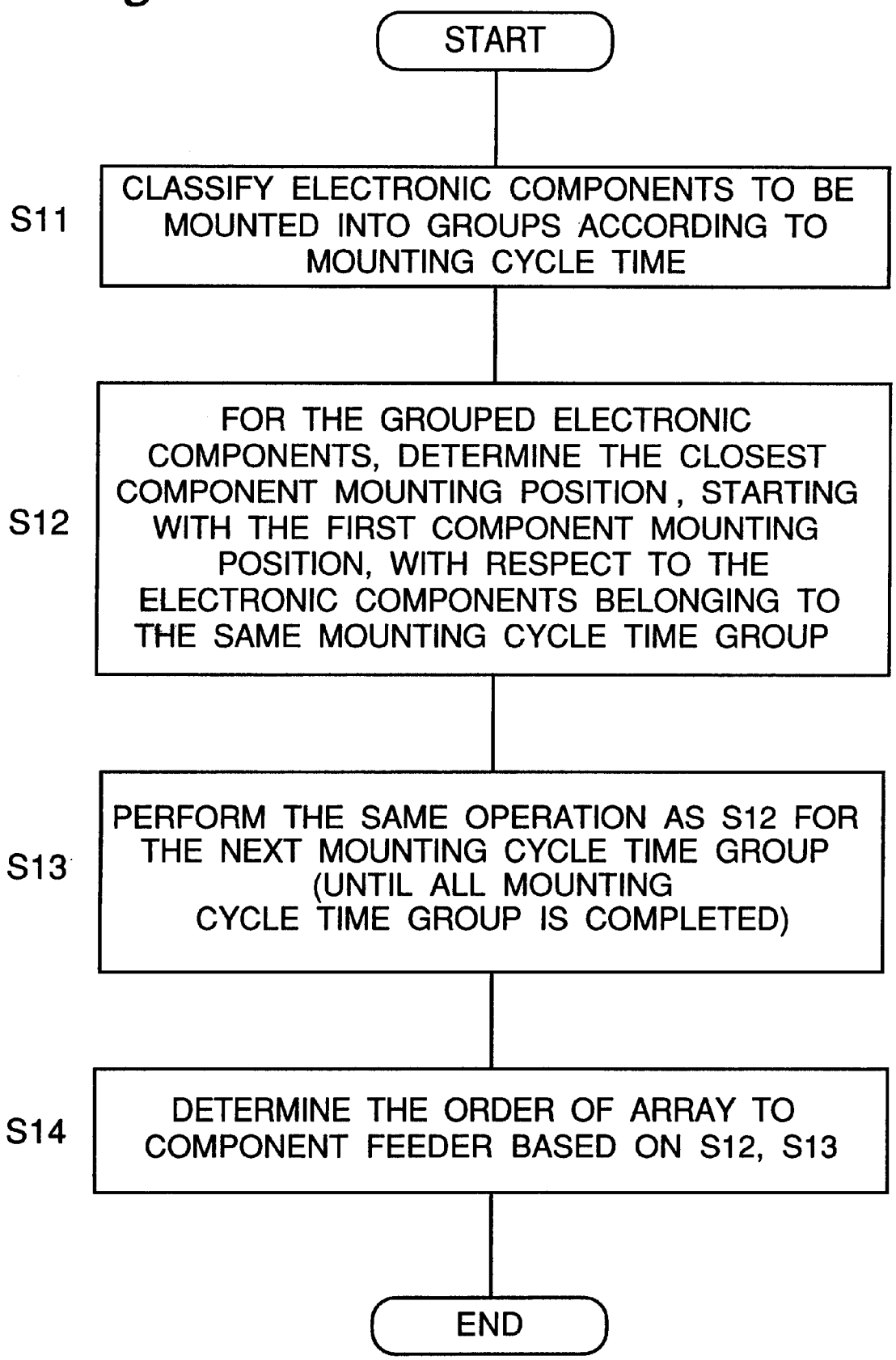
FIG. 1 is a flow chart showing the operation in the component mounting method which is one embodiment of the present invention.

Before the description of the present invention proceeds, it is to be noted that like parts are designated by like reference numerals throughout the accompanying drawings.

Figure 3A:
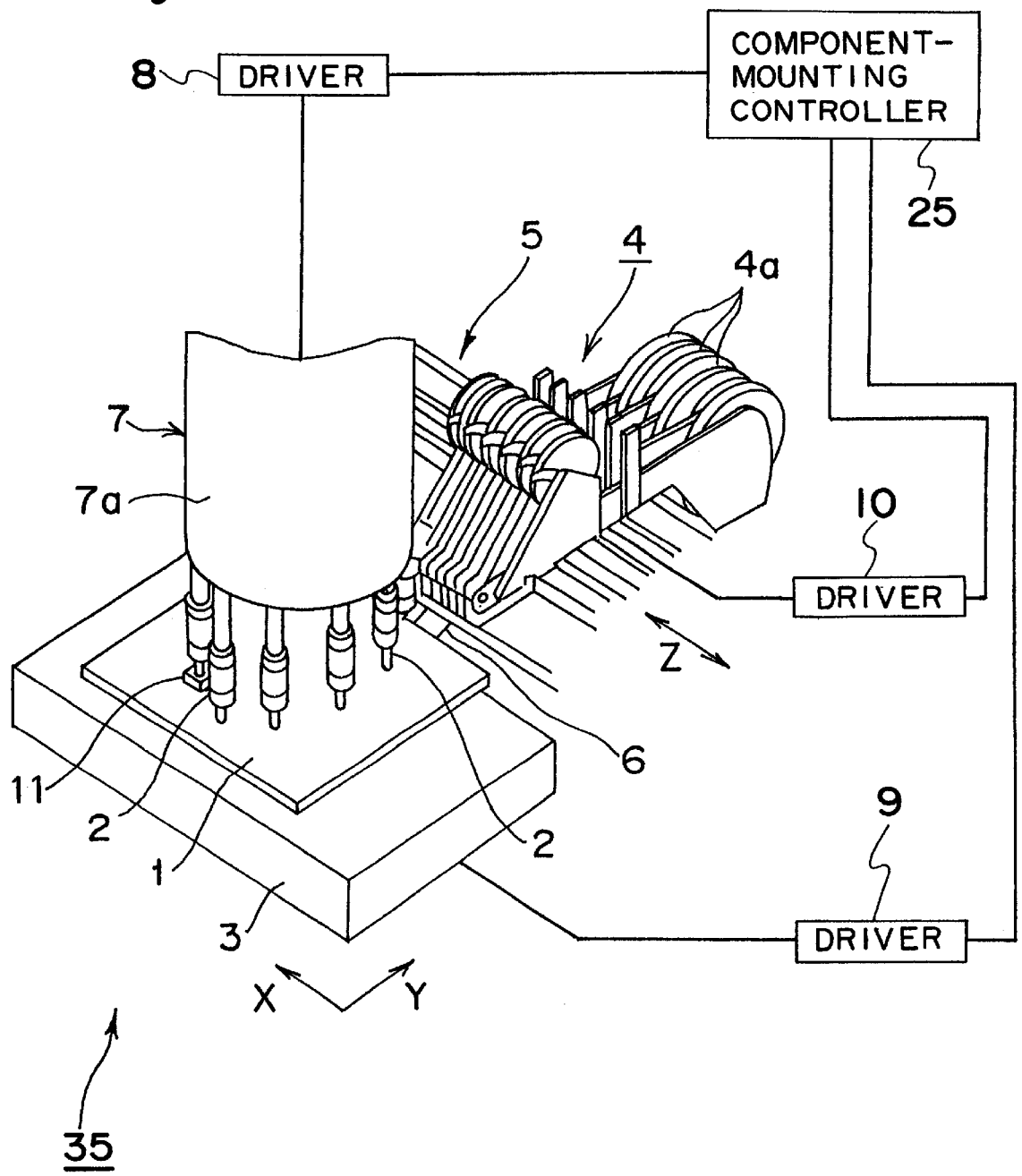
FIG. 3A is a view showing the configuration of the component mounting apparatus of the embodiment.
Figure 3B:
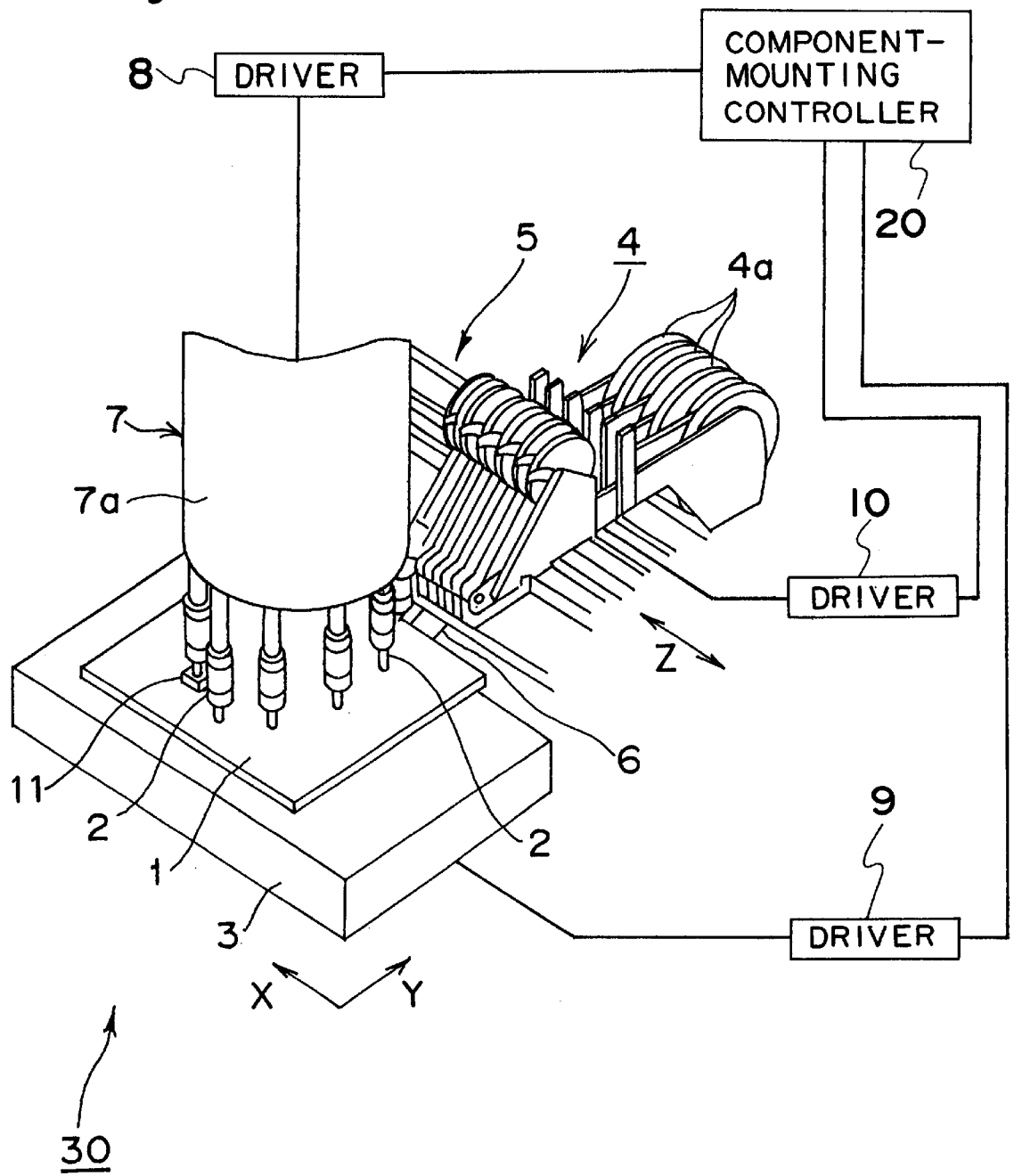
FIG. 3B is a view showing the configuration of a prior-art component mounting apparatus.
Figure 5:
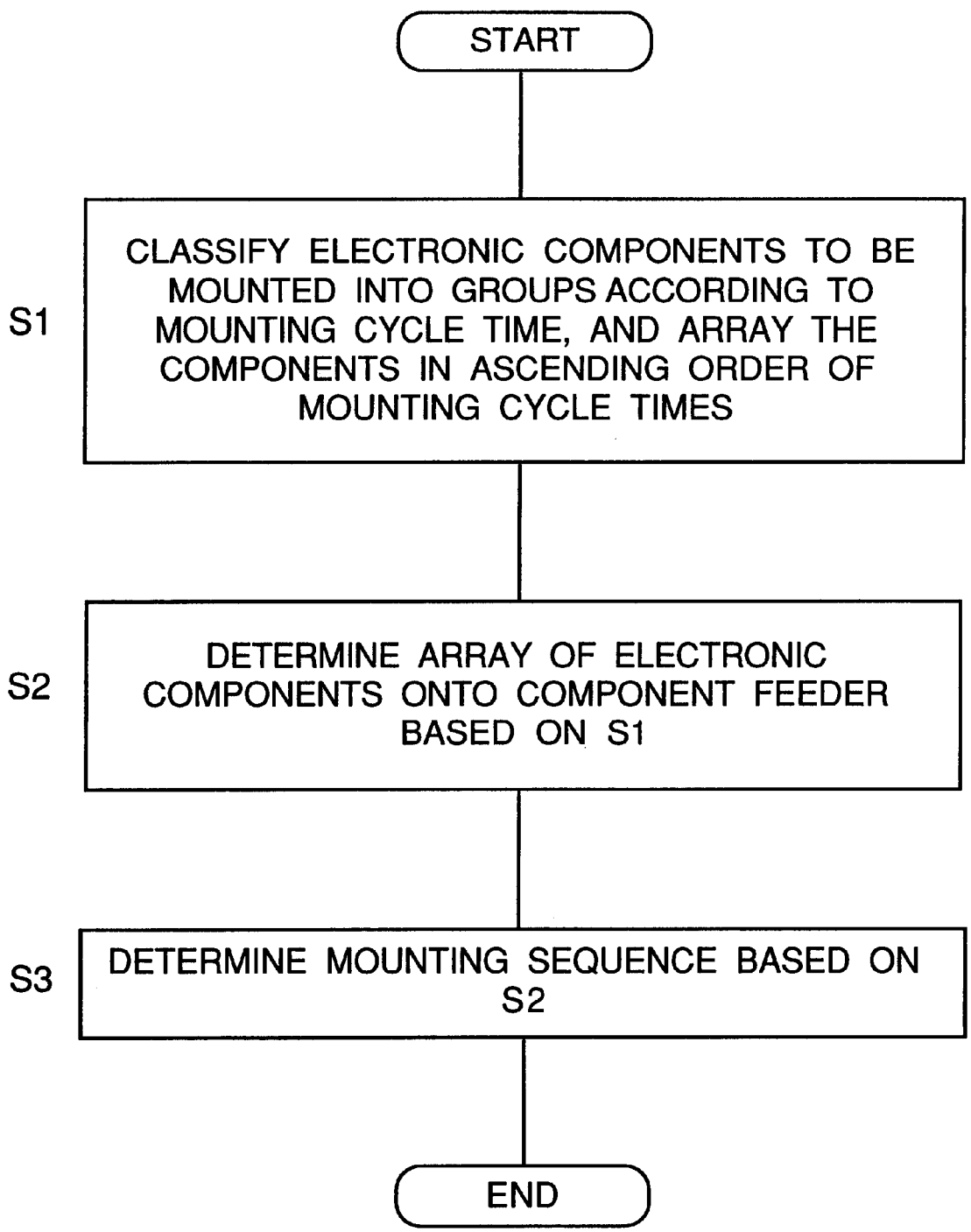
FIG. 5 is a flow chart showing the operation in the prior-art component mounting method.

A component mounting method which is an embodiment of the present invention, and a component mounting apparatus 35 to which the component mounting method is applied, are described below with reference to the accompanying drawings. The following description will be made by way of example of the method and apparatus for mounting electronic components onto a printed board, as described above with reference to FIG. 3A. However, the component mounting method and apparatus of this embodiment are not limited to this example. That is, in this example, the "component" in the present invention is exemplified by electronic components in the embodiments. Also, the "component holding portion" for holding, and releasing from the holding, the "component" in the present invention is exemplified by suction nozzles in the embodiments, and the "component holder" in the present invention is exemplified by a rotating table in the embodiments. Also, the "table" in the present invention is exemplified by an X-Y table in the embodiments. Therefore, the move direction of the "table" is not limited to the so-called X, Y directions, meaning that the X direction and the Z direction are not necessary parallel with each other.

Figure 2:
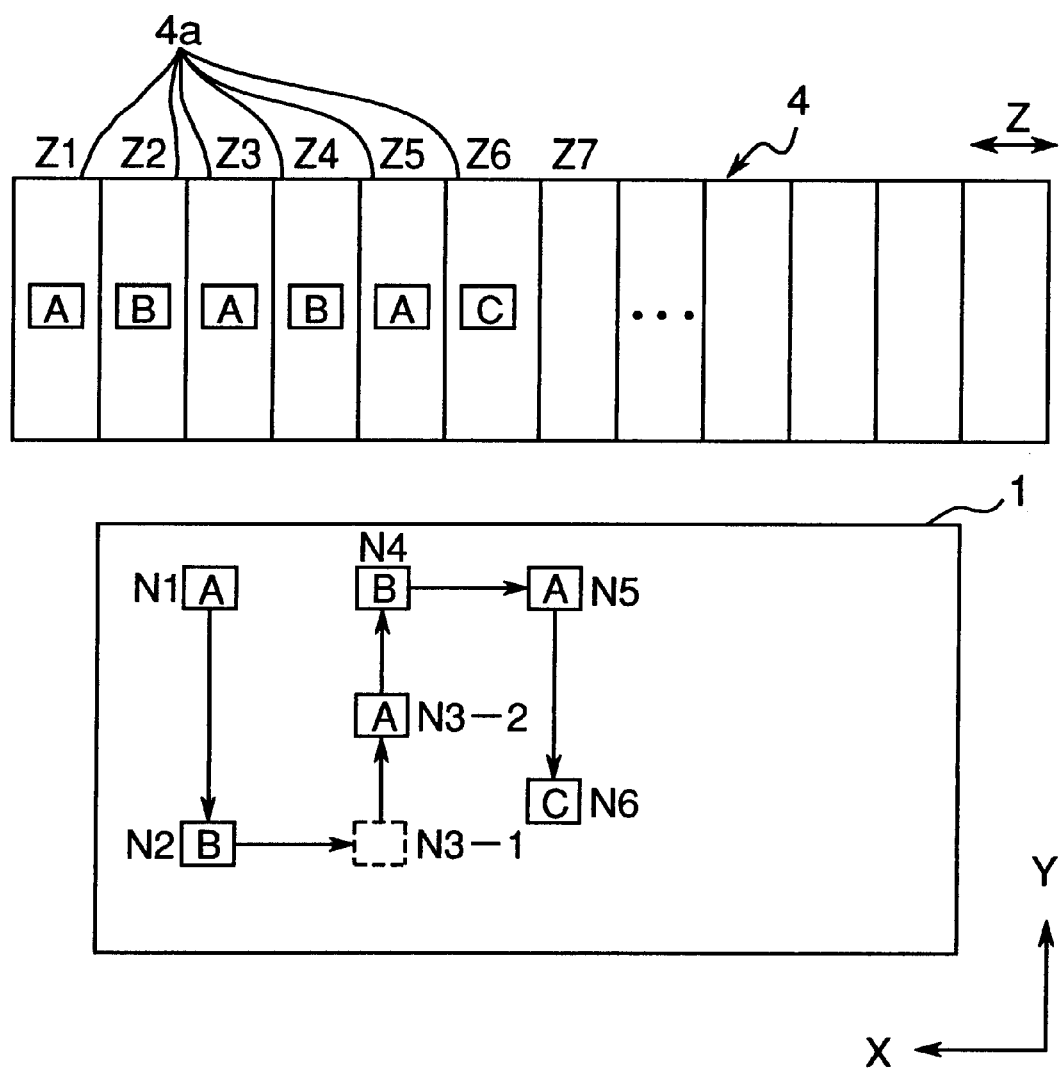
FIG. 2 is a view showing the order in which electronic components are arrayed onto a component feeder included in a component mounting apparatus that implements the component mounting method as shown in FIG. 1, and also showing the sequence of mounting onto a printed board and the types of electronic components to be mounted.

As in the foregoing description made by referring to FIG. 4, it is assumed that 3 pieces of electronic components A, 2 pieces of electronic components B and 1 piece of electronic components C are mounted onto the printed board 1 as shown in FIG. 2.

In such a case, according to the flow chart shown in FIG. 1, first at Step 11, the electronic components A to C to be mounted are classified into a plurality of groups. Those having the same mounting cycle time are taken as one group, depending on the mounting cycle times that the electronic components A to C have, respectively. In this embodiment, if the mounting cycle time of the electronic components A and B is 0.1 second and the mounting cycle time of the electronic components C is 0.2 second, then the electronic components A to C are classified into such totally two process groups that the electronic components A and B are taken as one group and the electronic components C are taken as one group. In addition, the classifying process of Step 11 is done in advance by classifying equipment or operators or the like.

Next, at Step 12 to Step 14, feed tape reels to which electronic components are attached are arrayed in the Z direction as shown in the figure (the Z direction being the direction in which the component feeder 4 moves) in the component accommodating units 4a arranged along the Z direction. The feed tape reels are accommodated in the component accommodating units 4a because the electronic components are treated in this embodiment. However, it is not always the case to use such feed tape reels for components other than electric components.

Hereinbelow, the method of arraying the electronic components along the Z direction as described above is explained.

The electronic components A to C are arrayed by talking into consideration the sequence in which the electronic components A to C are mounted to the printed board 1, as described below. Further, since the table body 7a will not move as stated before, it is necessary for the component feeder 4 to move in the Z direction in order that the component accommodating units 4a of the component feeder 4 are located at the component holding position where the suction nozzles 2 hold the electronic components. It is also necessary for the X-Y table 3 to move the component mounting position on the printed board 1 to the hold releasing position where the suction nozzles 2 release the electronic components from the holding Accordingly, to reduce the time required from the holding of the electronic components to the mounting thereof as much as possible, it is appropriate in principle to determine the mounting sequence so that the move amounts of the component feeder 4 and the X-Y table 3 become shorter. Furthermore, to make the time required for the mounting even shorter, the array is determined in order, starting with the groups having the shortest mounting cycle time based on the process of Step 11, i.e., in an ascending order of the mounting cycle time based on the processing of Step 11, i.e. in an ascending order of the mounting cycle times. That is, in this embodiment, the array of electronic components A, B is first determined, and then the array of the electronic components C is determined.

Referring to Steps 12 and 13, the aforementioned mounting sequence is described in detail. It is assumed that the printed board 1 placed on the X-Y table 3 is located at an initial mounting position by a movement of the X-Y table 3 at a start of the mounting process. When the printed board 1 is located at the initial mounting position, the electronic components are mounted onto the printed board 1, starting with a first component mounting position on the printed board 1. The first component mounting position is located at an end of the printed board 1, and is the closest mounting position to the hold releasing position. In this embodiment, a component mounting position N1 corresponds to the above first component mounting position as shown in FIG. 2. Accordingly, the X-Y table 3 is moved so that the first component mounting position N1 coincides with the hold releasing position. Also, since the mounting is carried on in the ascending order of the mounting cycle times of electronic components as stated before, it is assumed in this embodiment that one of the electronic components A that belong to a group of the shorter mounting cycle time is mounted at the component mounting position N1. In addition, in order to reduce the times required for mounting, it is generally recommendable to mount one of the electronic components at the component mounting position closest to the component mounting position N1. However, because of the need for taking into consideration the moving time of the X-Y table 3 for the reduction of the mounting time as stated above, it is assumed in this embodiment that the mounting is carried on basically along the Y direction. Therefore, a second component mounting position where one of the electronic components A or one of the electronic components B is next mounted is determined along the Y direction with respect to an array of component mounting positions arrayed at the same X1 coordinate position as the component mounting position N1. In this embodiment, a component mounting position N2 corresponds to the second component mounting position, and one of the electronic components B is mounted at the component mounting position N2.

When there has been no component mounting position left for mounting the electronic component A and the electronic component B in the component mounting position array to be arrayed at the X1 coordinate position, the printed board 1 is moved in the X direction by the X-Y table 3 up to a component mounting position array to be arrayed at an X2 coordinate position adjacent to the X1 coordinate position. Then, in the component mounting position array to be arrayed at the X2 coordinate position, the mounting process is carried on while finding the component mounting position where the electronic component A or B is mounted in the Y direction, as in the case of the X1 coordinate position. At the X2 coordinate position, the direction in which the mounting is carried on is made different from the direction in which the mounting is carried on at the X1 coordinate position. Accordingly, at the X2 coordinate position, the electronic component A is mounted at a component mounting position N3-2 corresponding to a third component mounting position, and the electronic component B is mounted at a component mounting position N4 corresponding to a fourth component mounting position. At a time point when the electronic component B has been mounted to the component mounting position N4, no component mounting position where the electronic component A and B is mounted remains at the X2 coordinate position. Therefore, the printed board 1 is moved along the X direction to an X3 coordinate position adjacent to the X2 coordinate position. Then, the mounting process is carried on along the Y direction in the component mounting position array to be arrayed at the X3 coordinate position. It is noted that the direction of this mounting is different from the direction in which the mounting is carried on at the X2 coordinate position. Accordingly, as shown in the figure, the electronic component A is mounted at a component mounting position N5 corresponding to a fifth component mounting position. From this point on, component mounting positions where the electronic components A or B are mounted are determined successively, such as the X3 coordinate position, the X4 coordinate position, etc. However, in this embodiment, it is assumed that no component mounting position where the electronic component A or B is mounted is present in the component mounting position N5 and followings. In this way, at a time point when the mounting of the electronic components belonging to the group of the shortest mounting cycle time has been completed, the mounting of electronic components belonging to the group of the next shortest mounting cycle time is started. That is, in this embodiment, the mounting of the electronic components C is started.

In this embodiment, the directions in which the mounting is carried on have been made different between adjacent component mounting position arrays as described above, but are not limited to this. For example, along the entire length of a component mounting position array, the component mounting position array may be shifted to its adjacent component mounting position array. Then the mounting is carried out in the same direction for the adjacent component mounting position arrays.

With the electronic components C, as in the electronic components A or B, the mounting is carried on in a search for component mounting positions, starting with the component mounting position N1, along the Y direction. The directions in which the mounting is carried on are varied between adjacent X coordinate positions. In addition, in this embodiment, it is assumed that the electronic component C is mounted only at the component mounting position N6 arrayed at the X3 coordinate position where the aforementioned component mounting position N5 is located, and that the electronic component C is mounted at the component mounting position N6 after the electronic component A has been mounted to the component mounting position N5.

In order to execute the component mounting method of this embodiment as described above, the operational control of the drivers 8 to 9 as well as the control of the mounting sequence are implemented by the component mounting controller 25.

As seen above, in this embodiment, when the mounting of the electronic components is carried on in the sequence from the component mounting position N1 to the component mounting position N6 in one printed board 1, the electronic components to be used will be an electronic component A, an electronic component B, an electronic component A, an electronic component B, an electronic component A and an electronic component C. At Step 14, as shown in FIG. 2, component accommodating units Z1 through Z6 are equivalent to the component accommodating units 4a arrayed along the Z direction in the component feeder 4. Therefore, electronic component A, the electronic component B, the electronic component A, the electronic component B, the electronic component A and the electronic component C are arrayed along the Z direction in the component accommodating units Z1–Z6, in correspondence to the respective mounting sequences of the electronic components A to C onto the printed board 1.

Further, when the electronic component C is also mounted at, for example, a component mounting position N3-1 included in the component mounting position array at the X2 coordinate position in addition to the component mounting position N6, an electronic component C to be mounted at the component mounting position N3-1 is accommodated in a component feed unit 4a of the component feeder 4 located at Z6. In addition, another electronic component C to be mounted at the component mounting position N6 is accommodated in another component feed unit 4a located at Z7.

The respective electronic components are arrayed in the component feeder 4 along the Z direction in correspondence to the respective mounting sequences of the electronic components to be mounted at the respective component mounting positions on the printed board 1 as shown above. Thus, when the mounting of electronic components onto one printed board 1 has been completed, the amount of consumption of the electronic components arrayed in the component accommodating units 4a becomes equal among the component accommodating units 4a, irrespective of the type of the electronic components. Therefore, if electronic components of the same number are fed to the rescue component accommodating units 4a, the electronic components can be exhausted out at the same time in the component feeder 4. Thus, the frequency at which the component mounting apparatus comes to a halt due to component exhaustion, as would often be involved in the prior art, can be reduced, while the operation rate of the component mounting apparatus can be improved. Moreover, the unattended operating time, which does not require monitoring by the operator, can be increased, so that the productivity can be improved. For example, in the case where 5000 pieces of electronic components are fed to each of the component accommodating units 4a, if it takes 30 seconds to mount all the electronic components onto one printed board 1, then a continuous operation of about 41.6 hour (=30 second×5000 board) can be realized, which is sitable for unattended operation during the night.

It is also possible to combine such a conventional method as described with reference to FIG. 4, in which electronic components of the same type are gathered in one component accommodating unit 4a, and the method of this embodiment as described above, in which all the electronic components to be mounted onto a printed board are arrayed in the mounting sequence in the respective component accommodating units 4a of the component feeder 4. For example, when electronic components A to E are mounted onto one printed board, it is possible to apply the method of this embodiment to the electronic components A to C and to apply the conventional method to the electronic components D, E. In such a type of combination with the conventional method, the electronic components A to C will come to exhaustion at the same time, so that the aforementioned effects of this embodiment can be produced. Also with respect to the electronic components D, E, accommodating a number of electronic components D, E corresponding to an integral multiple of the number of electronic components needed to make up one printed board 1 allows the electronic components D, E also to be exhausted at the same time. Besides, since a number n of each of the electronic components A to C is fed, feeding a number of electronic components corresponding to an n multiple of the number of electronic components necessary for one printed board allows all the electronic components A to E to be exhausted at the same time.

Also, electronic components that can be fed to the component feeder 4 only in a small number (e.g., 1000 pieces) at one time may be arrayed in such a range (e.g., 5) that the electronic components can be placed in the component accommodating units 4a along the Z axis. In such a case, the electronic components can be treated in the same manner as with other large-capacity component feed capability by such an alternate mechanism as disclosed in Japanese Patent Publication No. 7-83198.

Furthermore, in this embodiment, it has been arranged not only that electronic components are arrayed in the component feeder 4 along the Z direction in correspondence to the respective mounting sequences of the electronic components onto the printed board 1, but also that the electronic components to be mounted are classified into groups according to the mounting cycle time, and are arrayed in the ascending order of the mounting cycle times. Further, the mounting sequences are determined by referencing, for example, the Y direction. Thus, in addition to the effects of improvement in the operation rate of the component mounting apparatus as well as improvement in the productivity, it becomes possible to accomplish further faster component mounting.

In the present embodiment, the component mounting positions in the printed board 1 have been aligned with the hold releasing position of the suction nozzles 2 by the X-Y table 3 being moved. However, it is also possible to move the table body 7a of the rotating table 7 without moving the X-Y table 3.

Also, the component feeder 4 may be implemented by taping reel type, bulk type, tray type, stick type or the like.

As described in detail above, according to the component mounting method of the first aspect of the present invention and the component mounting apparatus of the second aspect, the individual components are arrayed at the component feeder along the feeder's moving direction in accordance with the respective mounting sequence of the components to be mounted at their respective component mounting positions on the printed board. The arrayed components are mounted at the printed board according to the mounting sequence. Accordingly, when the mounting of components onto one printed board is completed, the components arrayed in the component feeder have been consumed one each. This allows the components, which have been fed to the component feeder, to be exhausted at the same time. As a result, the frequency at which the component mounting apparatus comes to a halt due to component exhaustion can be reduced, while the operation rate of the component mounting apparatus can be improved. Moreover, the time of unattended operation that requires no monitoring of the operator can be increased, so that the productivity can be improved.

The entire disclosure of Japanese Patent Application No. 8-149062 filed on Jun. 11, 1996, including specifications, claims, drawings, and summaries are incorporated herein by reference in their entireties.

Although the present invention has been fully described in connection with the preferred embodiments thereof with reference to the accompanying drawings, it is to be noted that various changes and modifications are apparent to those skilled in the art. Such changes arid modifications are to be understood as included within the scope of the present invention as defined by the appended claims unless they depart therefrom.

What is claimed is:

1. A component mounting method comprising:

defining a mounting sequence of a plurality of different types of components to be mounted on a printed circuit board;

arraying component accommodating units accommodating the components in a component feeder in accordance with the mounting sequence, a total number of component accommodating units arrayed in the component feeder being equal to a total number of components to be mounted on each printed circuit board, each of the component accommodating units accommodating one type of component;

arranging the printed circuit board on a movable X-Y table;

successively removing a component from each of the respective component accommodating units in the component feeder by using a component holder;

successively moving the component feeder in a predetermined feeder moving direction after the component is successively removed from each of the respective component accommodating units in the component feeder;

holding at least one of the removed components at a component holding position by using the component holder;

moving the at least one held component to a component releasing position by using the component holder;

moving the X-Y table so as to align a component mounting position on the printed circuit board with the component releasing position;

releasing the at least one held component at the component releasing position; and mounting the released component at the component mounting position on the printed circuit board.

2. The method of claim 1, wherein said defining of the mounting sequence comprises defining a mounting sequence such that said moving of the X-Y table is minimized.

3. The method of claim 1, wherein said arraying of the component accommodating units comprises arraying a first component accommodating unit to an nth component accommodating unit in order in the component feeder in the feeder moving direction, wherein n is an integer of at least 2; and wherein when the printed circuit board is moved to an initial mounting position by the X-Y table at a start of the component mounting method, said defining of the mounting sequence for the components in the first component accommodating unit to the components in the nth component accommodating unit comprises defining a mounting sequence such that an immediate component mounting position at which an immediate component is to be mounted is closest to a succeeding mounting position at which a succeeding component is to be next mounted after the immediate component is mounted.

4. The method of claim 2, wherein said arraying of the component accommodating units in the component feeder comprises accommodating one type of component in each of the component accommodating units along the feeder moving direction in accordance with the mounting sequence such that each of the component accommodating units accommodates an equal number of components.

5. The method of claim 1, wherein said arraying of the component accommodating units comprises arraying a first component accommodating unit to an nth component accommodating unit in order in the component feeder in the feeder moving direction, wherein n is an integer of at least 2; and wherein when the printed circuit board is moved to an initial mounting position by the X-Y table at a start of the component mounting method, said defining of the mounting sequence for the components in the first component accommodating unit to the components in the nth component accommodating unit comprises defining a mounting sequence such that an immediate component mounting position at which an immediate component is to be mounted is closest to a succeeding mounting position at which a succeeding component is to be next mounted after the immediate component is mounted.

6. The method of claim 5, wherein when the X-Y table is movable along an X-axis parallel to the feeder moving direction and along a Y-axis perpendicular to the X-axis and within a plane of the X-axis, said defining of the mounting sequence for the plurality of different types of components comprises defining the mounting sequence such that said mounting of the released components is to be conducted along a first direction of the X-axis at a first point along the Y-axis, and when said mounting along the first direction of the X-axis at the first point along the Y-axis is complete, the X-Y table is to be moved to a second point along the Y-axis adjacent to the first point and said mounting is to be conducted along a second direction of the X-axis opposite the first direction at the second point along the Y-axis, said mounting to be performed successively.

7. The method of claim 6, wherein said arraying of the component accommodating units in the component feeder comprises accommodating one type of component in each of the component accommodating units along the feeder moving direction in accordance with the mounting sequence such that each of the component accommodating units accommodates an equal number of components.

8. The method of claim 5, wherein said arraying of the component accommodating units in the component feeder comprises accommodating one type of component in each of the component accommodating units along the feeder moving direction in accordance with the mounting sequence such that each of the component accommodating units accommodates an equal number of components.

9. The method of claim 1, wherein said arraying of the component accommodating units comprises:

classifying the different types of components into groups according to a mounting cycle time for each of the types of components such that each component in each of the groups has a same mounting cycle time;

arranging the component accommodating units containing the types of components of each group in the component feeder such that the groups are arranged in ascending order within the component feeder along the feeder moving direction from a group having a shortest mounting cycle time to a group having a largest mounting cycle time; and arranging the component accommodating units in each of the groups according to the mounting sequence such that a movement of the X-Y table is minimized.

10. The method of claim 7, wherein said arraying of the component accommodating units in the component feeder comprises accommodating one type of component in each of the component accommodating units along the feeder moving direction in accordance with the mounting sequence such that each of the component accommodating units accommodates an equal number of components.

11. The method of claim 1, wherein said arraying of the component accommodating units in the component feeder comprises accommodating one type of component in each of the component accommodating units along the feeder moving direction in accordance with the mounting sequence such that each of the component accommodating units accommodates an equal number of components.

12. A component mounting method comprising:

defining a mounting sequence of a plurality of different types components to be mounted on a printed circuit board;

gathering the components into groups, each of the groups including components of a same type;

positioning each of the groups of components in a respective one of a plurality of component accommodating units, a total number of component accommodating units being equal to a total number of components to be mounted on each printed circuit board;

arraying the component accommodating units in a component feeder irrespective of the mounting sequence;

arranging the printed circuit board on a movable X-Y table;

successively moving the component feeder according to the mounting sequence so as to place at least one component of a respective one of the component accommodating units at a component removing position;

successively removing the at least one component from the component feeder by using a component holder after the at least one component has been moved to the component removing position;

holding the at least one removed component at a component holding position by using the component holder;

moving the at least one held component to a component releasing position by using the component holder;

moving the X-Y table so as to align a component mounting position on the printed circuit board with the component releasing position;

releasing the at least one held component at the component releasing position; and mounting the released component at the component mounting position on the printed circuit board.

13. The method of claim 11, wherein said defining of the mounting sequence comprises defining a mounting sequence such that said moving of the X-Y table is minimized.

14. The method of claim 12, wherein said arraying of the component accommodating units comprises arraying a first component accommodating unit to an nth component accommodating unit in order in the component feeder in the feeder moving direction, wherein n is an integer of at least 2; and wherein when the printed circuit board is moved to an initial mounting position by the X-Y table at a start of the component mounting method, said defining of the mounting sequence for the components in the first component accommodating unit to the components in the nth component accommodating unit comprises defining a mounting sequence such that an immediate component mounting position at which an immediate component is to be mounted is closest to a succeeding mounting position at which a succeeding component is to be next mounted after the immediate component is mounted.

15. The method of claim 14, wherein when the X-Y table is movable along an X-axis parallel to the feeder moving direction and along a Y-axis perpendicular to the X-axis and within a plane of the X-axis, said defining of the mounting sequence for the plurality of different types of components comprises defining the mounting sequence such that said mounting of the released components is to be conducted along a first direction of the X-axis at a first point along the Y-axis, and when said mounting along the first direction of the X-axis at the first point along the Y-axis is complete, the X-Y table is to be moved to a second point along the Y-axis adjacent to the first point and said mounting is to be conducted along a second direction of the X-axis opposite the first direction at the second point along the Y-axis, said mounting to be performed successively.

16. The method of claim 12, wherein said arraying of the component accommodating units in the component feeder comprises accommodating one type of component in each of the component accommodating units along the feeder moving direction in accordance with the mounting sequence such that each of the component accommodating units accommodates an equal number of components.

17. A component mounting apparatus comprising:

a component holder having a component holding portion for holding a component to be mounted on a printed circuit board and for releasing the held component at a component releasing position, said component holder being operable to move between an initial component holding position and the component releasing position;

a component feeder for holding a plurality of component accommodating units arrayed in said component feeder along a component feeder moving direction, a total number of component accommodating units being equal to a total number of components to be mounted on each printed circuit board, each of said component accommodating units accommodating a plurality of one type of components, said component feeder being operable to successively move in the component feeder moving direction after a component from each of the component accommodating units is removed by said component holding portion of said component holder;

a movable X-Y table for holding the printed circuit board and for moving the printed circuit board relative to said component holder to a component mounting position; and a component-mounting controller for controlling an operation of said movable X-Y table based on a predetermined mounting sequence of the components such that the component mounting position of the printed circuit board is aligned with the component releasing position of said component holder.

18. The apparatus of claim 17, wherein:

when a first component accommodating unit to an nth component accommodating unit are arrayed in order in said component feeder along the feeder moving direction, wherein n is an integer of at least 2, and when the printed circuit board is moved to an initial mounting position by said X-Y table at a start of the component mounting method, and when the X-Y table is movable along an X-axis parallel to the feeder moving direction and along a Y-axis perpendicular to the X-axis and within a plane of the X-axis;

said component-mounting controller being operable to control the predetermined mounting sequence such that mounting of the released components is conducted along a first direction of the X-axis at a first point along the Y-axis, and when the mounting along the first direction of the X-axis at the first point along the Y-axis is complete, said component-mounting controller is operable to move said X-Y table to a second point along the Y-axis adjacent to the first point so that mounting is conducted along a second direction of the X-axis opposite the first direction at the second point along the Y-axis; and said component-mounting controller being operable to control the mounting sequence such that the mounting is performed successively so that an immediate component mounting position at which an immediate component is to be mounted is closest to a succeeding mounting position at which a succeeding component is to be next mounted after the immediate component is mounted.

19. The apparatus of claim 18, wherein said component accommodating units are to be arrayed in said component feeder by classifying different types of components into groups according to a mounting cycle time for each of the components such that each component in each of the groups has a same mounting cycle time;

arranging said component accommodating units in said component feeder such that the groups are arranged in ascending order within said component feeder along the feeder moving direction from a group having a shortest mounting cycle time to a group having a largest mounting cycle time; and arranging said component accommodating units accommodating components from each of the groups according to the mounting sequence such that a movement of said X-Y table is minimized.

20. The apparatus of claim 19, wherein said component feeder is adapted to hold component accommodating units accommodating components from one of a plurality of groups, each of the groups including components of a same type, and the groups are to be arrayed in said component feeder irrespective of the mounting sequence;

said component feeder being operable to successively move according to the mounting sequence so as to successively place the components at a component removing position; and said component holder being operable to successively mount the components at the component mounting position on the printed circuit board.

21. The apparatus of claim 19, wherein each of said component accommodating units accommodates an equal number of components.

22. The apparatus of claim 18, wherein said component feeder is adapted to hold component accommodating units accommodating components from one of a plurality of groups, each of the groups including components of a same type, and the groups are to be arrayed in said component feeder irrespective of the mounting sequence;

said component feeder being operable to successively move according to the mounting sequence so as to successively place the components at a component removing position; and said component holder being operable to successively mount the components at the component mounting position on the printed circuit board.

23. The apparatus of claim 22, wherein each of said component accommodating units accommodates an equal number of components.

24. The apparatus of claim 18, wherein each of said component accommodating units accommodates an equal number of components.

* * * * *